(12) United States Patent
Yang et al.

(10) Patent No.: US 8,748,981 B2
(45) Date of Patent: Jun. 10, 2014

(54) SEMICONDUCTOR DEVICE AND RELATED FABRICATION METHODS

(75) Inventors: Hongning Yang, Chandler, AZ (US); Xin Lin, Phoenix, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/606,438

(22) Filed: Sep. 7, 2012

(65) Prior Publication Data

US 2014/0070312 A1 Mar. 13, 2014

(51) Int. Cl.
*H01L 29/66* (2006.01)
*H01L 29/76* (2006.01)

(52) U.S. Cl.
USPC .......................... 257/337; 257/314; 257/343

(58) Field of Classification Search
USPC .......................................... 257/337, 343, 314
See application file for complete search history.

(56) References Cited

U.S. PATENT DOCUMENTS

| | | | |
|---|---|---|---|
| 5,569,949 A * | 10/1996 | Malhi | 257/397 |
| 6,352,901 B1 | 3/2002 | Chang | |
| 6,365,932 B1 * | 4/2002 | Kouno et al. | 257/341 |
| 8,193,585 B2 | 6/2012 | Grote et al. | |
| 8,193,595 B2 | 6/2012 | Mohanakrishnaswamy et al. | |
| 2003/0085414 A1 * | 5/2003 | Okuno et al. | 257/200 |
| 2004/0094783 A1 | 5/2004 | Hong | |
| 2005/0001248 A1 | 1/2005 | Rhodes | |
| 2005/0073007 A1 * | 4/2005 | Chen et al. | 257/355 |
| 2006/0081836 A1 * | 4/2006 | Kimura et al. | 257/19 |
| 2009/0085101 A1 * | 4/2009 | Huang et al. | 257/328 |
| 2010/0032758 A1 * | 2/2010 | Wang et al. | 257/343 |
| 2012/0112277 A1 | 5/2012 | Denison et al. | |

OTHER PUBLICATIONS

Remy Chravel et al, "N-Sinker formation by Phosphorous Silicon Glass Diffusion", 14th annual conference, ON Semiconductor, pp. 1-5 (2011).*
I. Betrand et al, "New lateral DMOS and IGBT structures realized on a partial SOI substrate based on LEGO process", IEEE BCTM 5.2, pp. 74-77 (2005).*
Adrian W. Ludikhuize, "A Review of RESURF Technology", the 12th International Symposium on Power Semiconductor Devices and ICs (ISPSD'2000), Copyright 2000 by the IEEE, Catalog No. 00CH37094C.
Piet Wessels, "Power Devices on SOI" MIGAS, Jun. 22, 2009.
Hongning Yang et al., Semiconductor Device and Related Fabrication Methods, U.S. Appl. No. 13/606,797, filed Sep. 7, 2012.
Adrian W. Ludikhuize, A Review of RESURF Technology, Article, Copyright 2000, Catalog No. 00CH37094C.
Piet Wessels, Power Devices on SOI, Jun. 22, 2009, Migas, NXP founded by Philips.
USPTO, Non-Final Office Action for U.S. Appl. No. 13/606,797, mailed Mar. 10, 2014.

* cited by examiner

*Primary Examiner* — Shaun Campbell
*Assistant Examiner* — Dzung Tran
(74) *Attorney, Agent, or Firm* — Ingrassia Fisher & Lorenz, P.C.

(57) ABSTRACT

Semiconductor device structures and related fabrication methods are provided. An exemplary semiconductor device structure includes a first vertical drift region of semiconductor material, a second vertical drift region of semiconductor material, and a buried lateral drift region of semiconductor material that abuts the vertical drift regions. In one or more embodiments, the vertical drift regions and buried lateral drift region have the same conductivity type, wherein a body region of the opposite conductivity type overlies the buried lateral drift region between the vertical drift regions.

16 Claims, 5 Drawing Sheets

SEMICONDUCTOR DEVICE AND RELATED FABRICATION METHODS

TECHNICAL FIELD

Embodiments of the subject matter described herein relate generally to semiconductor devices and methods for fabricating semiconductor devices, and more particularly, embodiments of the subject matter relate to methods for fabricating semiconductor devices having increased breakdown voltage.

BACKGROUND

During normal operation, the voltage applied to a semiconductor device is constrained by the breakdown voltage of the device, which is the minimum applied voltage that causes avalanche breakdown in the device. For example, the rated drain-to-source voltage of transistor devices is typically set to a value that is well below the drain-to-source voltage that causes avalanche breakdown in the device to provide sufficient margin that accommodates manufacturing variations and/or transient voltage fluctuations.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

In practice, efforts to decrease transistor size and/or minimize on-resistance may lower the breakdown voltage, and thereby, reduce the margin (or voltage difference) between the rated drain-to-source voltage and the breakdown voltage. Thus, it is desirable to increase the breakdown voltage of transistor devices while decreasing transistor size and/or minimizing on-resistance in order to accommodate a higher rated drain-to-source voltage or otherwise increase the margin to relax design windows and/or manufacturing requirements. Accordingly, embodiments of the subject matter described below distribute the drain voltage both vertically and laterally to increase or otherwise improve the drain-to-source breakdown voltage.

FIGS. 1-10 illustrate, in cross-section, methods for fabricating a semiconductor device structure 100 in accordance with exemplary embodiments. The semiconductor device structure 100 is a hybrid of a laterally diffused metal oxide semiconductor (LDMOS) field-effect transistor and a vertically diffused metal oxide semiconductor (VDMOS) field-effect transistor. Accordingly, the semiconductor device structure 100 may alternatively be referred to herein as a vertically and laterally diffused (VLDMOS) transistor. Although "MOS" properly refers to a device having a metal gate electrode and an oxide gate insulator, the subject matter may be utilized with any semiconductor device that includes a conductive gate electrode (whether metal or other conductive material) that is positioned with respect to a gate insulator (whether oxide or other insulator) which, in turn, is positioned with respect to a semiconductor substrate to implement a field-effect transistor, and the subject matter is not intended to be limited to a metal gate electrode and an oxide gate insulator. Furthermore, it should be appreciated that although the subject matter may be described herein in the context of an N-type (or N-channel) device, the subject matter is not intended to be limited to N-type devices and may be implemented in an equivalent manner for a P-type (or P-channel) device (e.g., by interchanging the conductivities of the doped regions). Various steps in the manufacture of MOS devices are well known and so, in the interest of brevity, many conventional steps will only be mentioned briefly herein or will be omitted entirely without providing the well known process details.

As described in greater detail below, the vertically and laterally diffused transistor structure includes a buried lateral drift region that extends between two vertical drift regions to provide a conductive path for current between a drain electrode of the transistor and a channel portion of a body region of the transistor. As used herein, a "drift region" should be understood as referring to a doped region of semiconductor material between a relatively higher doped drain region (or drain electrode contact region) and a channel region of a transistor device that supports the voltage bias at the drain region by distributing or otherwise dissipating the voltage (or electrical potential) of the drain region throughout the drift region while also providing a conductive path for current between the channel region and the drain region. In this regard, the VLDMOS transistor structure includes a vertical drift region underlying the drain region that supports the drain voltage bias and provides a vertical conductive path for current in a direction that is substantially perpendicular to the surface of the structure. The VLDMOS transistor structure also includes a vertical drift region underlying the gate electrode structure to provide another vertical conductive path for current that is substantially perpendicular to the surface of the structure and dissipate the drain voltage vertically. Additionally, the VLDMOS transistor structure includes a lateral drift region extending between the two vertical drift regions and abutting the vertical drift regions to provide a lateral conductive path for current between the vertical drift regions in a direction that is substantially parallel to the surface of the structure. In this manner, the lateral drift region cooperates with the vertical drift regions to support the drain voltage bias by dissipating the drain voltage laterally (or horizontally) between the vertical drift regions. The lateral drift region is buried in that the upper border of the lateral region is separated from the surface of the VLDMOS transistor structure by a region of semiconductor material having the opposite conductivity to the drift regions, which functions as a body region of the VLDMOS transistor structure. In this regard, the body region of the VLDMOS transistor structure resides between the vertical drift regions, such that the vertical drift regions are not adjacent to one another, and promotes vertical current flow and/or voltage distribution within the vertical drift regions because lateral current flow between the vertical drift regions through the body region is inhibited by virtue of the body region's opposing conductivity. In exemplary embodiments, the source region of the VLDMOS transistor structure is formed within the body region overlying the lateral drift region, such that at least a portion of the body region is disposed between the source region and a respective drift region. In this manner, by virtue of the lateral drift region being buried beneath a region having the opposite conductivity, the drain-to-source voltage is more effectively distributed or otherwise dissipated through the drift regions both vertically and laterally to increase or otherwise improve the breakdown voltage of the VLDMOS transistor. Although the subject matter is described herein in the context of forming the VLDMOS transistor in epitaxial silicon, the subject matter is not limited to epitaxial silicon and an equivalent VLDMOS transistor structure may be fabricated on bulk semiconductor material or other non-epitaxial semiconductor material in an appropriate manner.

Figure 1:
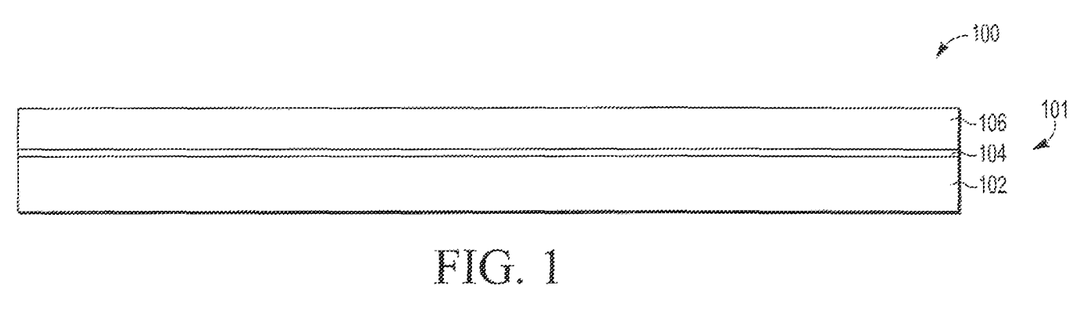
FIGS. 1-10 illustrate, in cross section, a semiconductor device structure and exemplary methods for fabricating the semiconductor device in accordance with one embodiment of the invention.

Referring now to FIG. 1, in exemplary embodiments, fabrication of the semiconductor device structure 100 begins by providing or otherwise obtaining a substrate 101 of semiconductor material. In the illustrated embodiment, the fabrication process begins by obtaining a silicon-on-insulator (SOI) substrate 101 having a support (or handle) layer 102 of semiconductor material, an insulating layer 104 of dielectric material on the support layer 102, and a layer 106 of semiconductor material on the insulating layer 104. As described in greater detail below, in exemplary embodiments, the layer 106 of semiconductor material is utilized to epitaxially grow additional semiconductor material for subsequently fabricating one or more transistor devices thereon, and accordingly, for convenience, but without limitation, the layer 106 of semiconductor material may alternatively be referred to herein as the seed layer. In an exemplary embodiment, the semiconductor material of each of the layers 102, 106 is realized as a silicon material, wherein the term "silicon material" is used herein to encompass the relatively pure silicon materials typically used in the semiconductor industry as well as silicon admixed with other elements such as germanium, carbon, and the like. Alternatively, one or more of the layers 102, 106 may be realized as germanium, gallium arsenide, and the like, and/or one or more of the layers 102, 106 may include layers of different semiconductor materials. In accordance with one embodiment, the insulating layer 104 is realized as an oxide layer formed in a subsurface region of the semiconductor substrate 101, also known as a buried oxide (BOX) layer. For example, the buried oxide layer 104 may be formed by oxidizing a wafer of semiconductor material (e.g., seed layer 106) which is then bonded to the support layer 102 to provide the buried layer 104 of oxide material between the support layer 102 and the seed layer 106. In exemplary embodiments, the support layer 102 and the seed layer 106 are each lightly doped. For example, for an N-type device, the seed layer 106 may be realized as a P-type silicon material having a P-type dopant concentration (e.g., boron ions or a boron ionized species) in the range of about $1\times10^{13}/cm^3$ to about $1\times10^{17}/cm^3$. Similarly, the support layer 102 may also be doped with the same conductivity-determining impurity type as the seed layer 106. It should be understood that the fabrication process described herein is not constrained by the substrate of semiconductor material utilized, and the fabrication process described herein may also be used to create devices from a bulk semiconductor substrate.

Figure 2:
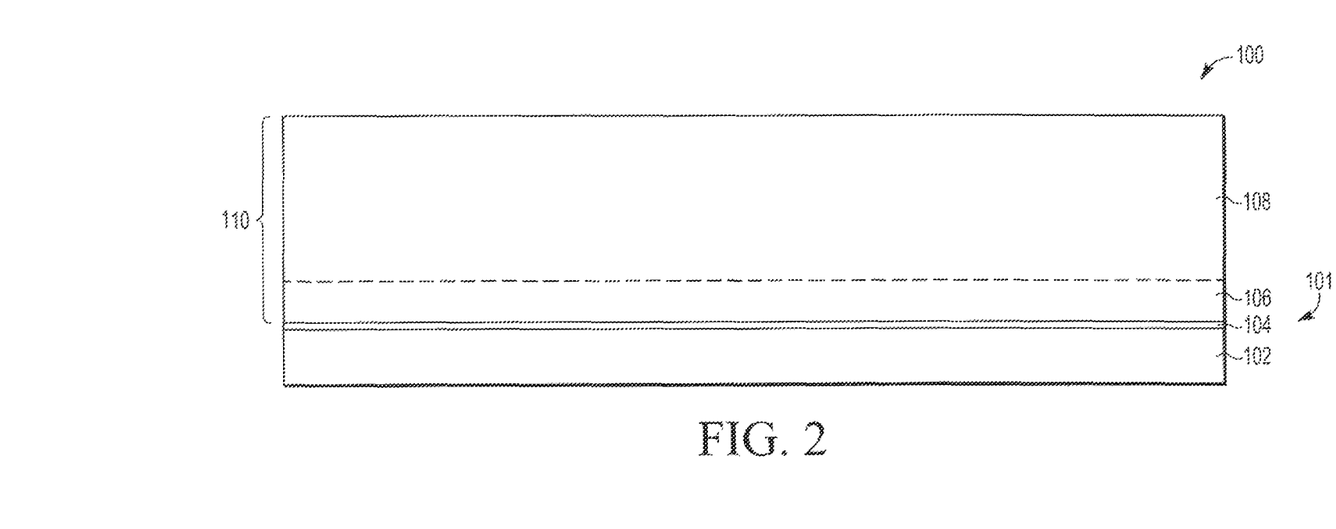

In accordance with one or more embodiments, the fabrication process continues by forming or otherwise providing an epitaxial layer 108 of semiconductor material on the seed layer 106 to provide an active region 110 of semiconductor material having a desired thickness and conductivity, resulting in the semiconductor device structure 100 illustrated in FIG. 2. In accordance with one or more embodiments, for an N-type device, the epitaxial layer 108 is formed by epitaxially growing silicon material on the seed layer 106 and in-situ doping the silicon material by adding boron ions (or other P-type ions) to the reactants used to epitaxially grow the layer 108. In one or more embodiments, for an N-type device, the epitaxial layer 108 has a P-type dopant concentration (e.g., boron ions or a boron ionized species) in the range of about $1\times10^{13}/cm^3$ to about $1\times10^{16}/cm^3$. In an exemplary embodiment, the epitaxial layer 108 is grown to a thickness such that a total thickness of the active region 110 (e.g., the sum of the thickness of the seed layer 106 and the epitaxial layer 108) is in the range of about 5 microns (or micrometers). For convenience and ease of explanation, the seed layer 106 and the epitaxial layer 108 may collectively be referred to herein as the active region 110 of substrate semiconductor material.

Figure 3:
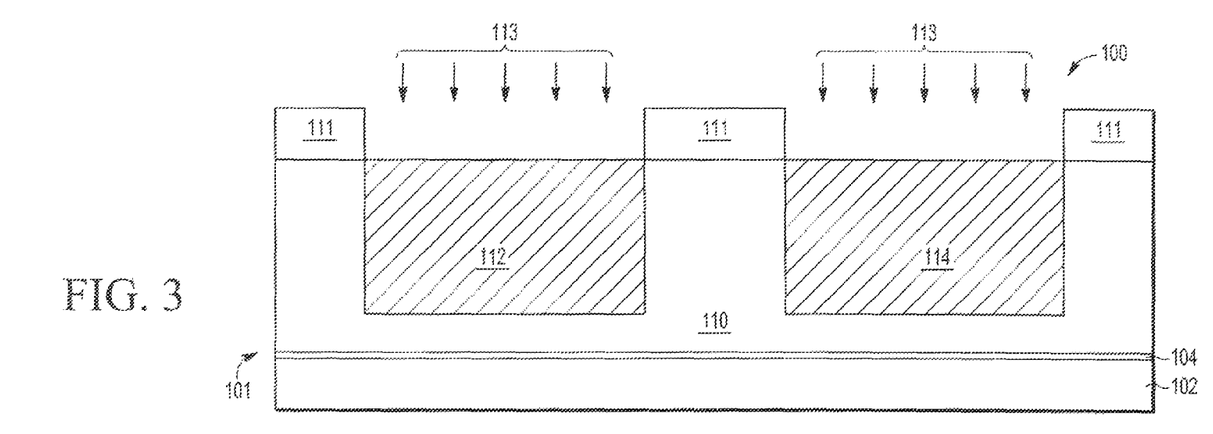

Referring now to FIG. 3, in exemplary embodiments, the fabrication process continues by forming regions 112, 114 of semiconductor material within the active region 110 that have a conductivity type that is opposite the conductivity of the active region 110 and a dopant concentration that is greater than the dopant concentration of the active region 110. As described in greater detail below, each of the regions 112, 114 function as a lateral drift region between the drain electrode and the conductive channel of the subsequently formed transistor structure. In an exemplary embodiment, the lateral drift regions 112, 114 are formed by masking the semiconductor device structure 100 with an implantation mask 111 that is patterned to expose the underlying regions of the active region 110 to be used for the lateral drift regions 112, 114. The regions 112, 114 are then formed by implanting ions of the conductivity-determining impurity type opposite the conductivity of the active region 110, illustrated by arrows 113, in the active region 110 with a dopant concentration in the range of about $1\times10^{15}/cm^3$ to about $5\times10^{16}/cm^3$ at an energy level of about 1000 kiloelectronvolts (keV) to about 2000 keV to provide the lateral drift regions 112, 114 having a depth (after subsequent thermal annealing and any other diffusion) that is greater than the depth of body regions subsequently formed in the lateral drift regions but less than the thickness of the active region 110. For example, in accordance with one embodiment, for an N-channel semiconductor device, lateral drift regions 112, 114 are formed by implanting N-type ions, such as phosphorous ions or a phosphorous ionized species, with a dopant concentration of about $1\times10^{15}/cm^3$ and an energy level of 1000 keV to 2000 keV to provide lateral drift regions 112, 114 having a depth in the range of about 1.5 microns to about 3 microns relative to the surface of the active region 110.

Figure 4:
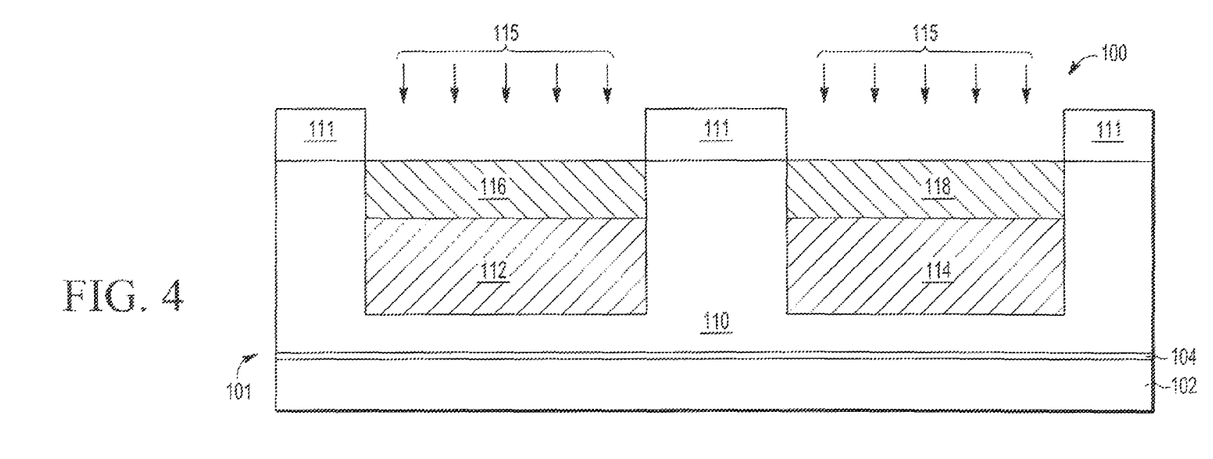

Referring now to FIG. 4, in exemplary embodiments, the fabrication process continues by forming regions 116, 118 of semiconductor material within the lateral drift regions 112, 114 that have a conductivity type that is opposite the conductivity of the lateral drift regions 112, 114. In this regard, the dopant concentration of the body regions 116, 118 may be similar to the dopant concentration of the lateral drift regions 112, 114 with the depth of the lateral drift regions 112, 114 being greater than the depth of the body regions 116, 118. As described in greater detail below, each of the regions 116, 118 function as a part of the body region of the subsequently formed VLDMOS transistor device, and accordingly, the regions 116, 118 may alternatively be referred to herein as body regions. In an exemplary embodiment, the body regions 116, 118 are formed using the same implantation mask 111 that was used for the lateral drift regions 112, 114. The body regions 116, 118 are formed by implanting ions of the opposite conductivity-determining impurity type, illustrated by arrows 115, in the lateral drift regions 112, 114 with a dopant concentration in the range of about $1 \times 10^{15}/cm^3$ to about $5 \times 10^{16}/cm^3$ at an energy level of about 50 keV to about 500 keV to provide the body regions 116, 118 having a depth (after subsequent thermal annealing and any other diffusion) that is less than the depth of the lateral drift regions 112, 114. For example, in accordance with one embodiment, for an N-channel semiconductor device, body regions 116, 118 are formed by implanting P-type ions, such as boron ions or a boron ionized species, with a dopant concentration of about $6 \times 10^{15}/cm^3$ and an energy level of 50 keV to 300 keV to provide body regions 116, 118 having a depth less than about 1.5 microns relative to the surface of the active region 110. In this manner, each respective body region 116, 118 overlies a respective lateral drift region 112, 114 with the lower boundary of a respective body region 116, 118 being adjacent to or otherwise abutting the upper boundary of a respective lateral drift region 112, 114. Thus, the upper boundaries of the lateral drift regions 112, 114 are spaced apart or otherwise separated from the upper surface of the active region 110 by the body regions 116, 118, that is, the lateral drift regions 112, 114 are buried beneath the body regions 116, 118.

Figure 5:
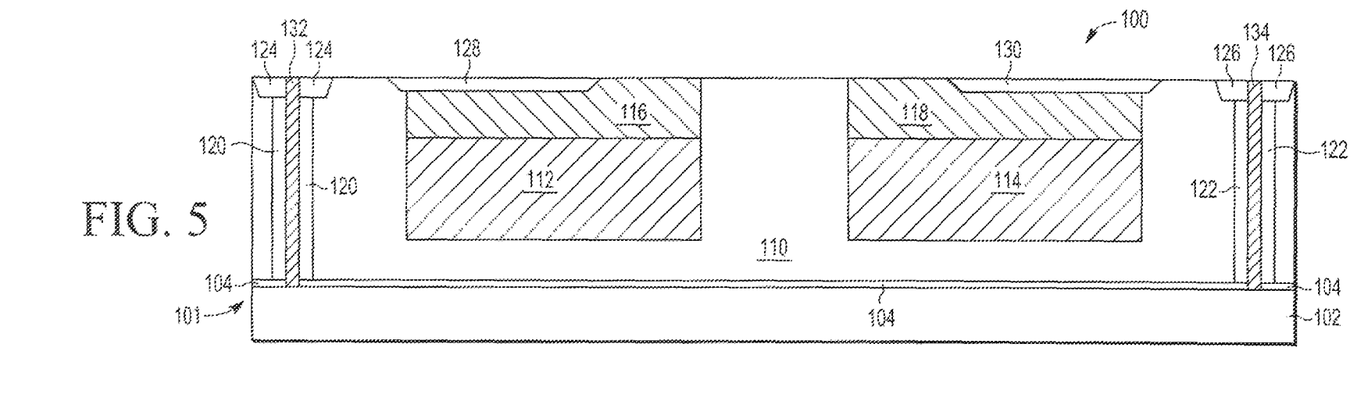

Referring now to FIG. 5, in an exemplary embodiment, after performing the ion implantation process steps to form the lateral drift regions 112, 114 and body regions 116, 118, the fabrication process continues by removing the implantation mask 111 forming isolation regions in the active region 110 of semiconductor material. In an exemplary embodiment, the fabrication process isolates the transistor device subsequently formed on the active region 110 from adjacent semiconductor devices performing deep trench isolation (DTI) to provide deep isolation regions 120, 122 of dielectric material. For example, to form deep isolation region 120, 122, the portions of the active region 110 to be utilized for the transistor device may be masked, and the mask may then be patterned to expose portions of the active region 110 which are then etched until the buried layer 104 is exposed, and a dielectric material, such as an oxide material, may be deposited to fill the trenches or grown on the exposed surfaces of the trenches, resulting in deep isolation regions 120, 122. After forming deep isolation regions 120, 122, the fabrication process continues by forming shallow isolation regions 124, 126, 128, 130 of a dielectric material by performing shallow trench isolation (STI). To form the shallow isolation regions 124, 126, 128, 130, the portions of the active region 110 to be utilized for the electrode regions of the transistor device are masked, and the mask is patterned to expose portions of the body regions 116, 118 and the deep isolation regions 120, 122 which are then etched to a depth that is less than the depth (or thickness) of the body regions 116, 118, and a dielectric material, such as an oxide material, may be deposited to fill the trenches, resulting in shallow isolation regions 124, 126, 128, 130. In this regard, the remaining portions of the body regions 116, 118 underlying the isolation regions 128, 130 are disposed vertically between the isolation regions 128, 130 and the lateral drift regions 112, 114, thereby separating the lateral drift regions 112, 114 from the isolation regions 128, 130. As described in greater detail below, the isolation regions 128, 130 are disposed laterally between the subsequently formed drain and source regions of the VLDMOS transistor structure and are biased to the drain voltage so that the VLDMOS transistor device is effectively a double reduced surface field (RESURF) device.

In the illustrated embodiment, after forming the shallow isolation regions 124, 126, 128, 130, the fabrication process continues by forming conductive (or semiconductive) contacts 132, 134 to the support layer 102 via the deep isolation regions 120, 122. To form the conductive contacts 132, 134, the portions of the active region 110 to be utilized for the transistor device are masked, and the mask is patterned to expose interior portions of the isolation regions 120, 122, 124, 126 then etched to a depth that is greater than or equal to the depth (or thickness) of the active region 110 and the buried layer 104 to expose the support layer, and a conductive (or semiconductive) material, such as a polysilicon material, may be deposited to fill the trenches, resulting in conductive contacts 132, 134. The conductive contacts 132, 134 may be utilized to bias the support layer 102 to a desired electrical potential (e.g., electrical ground), as described in greater detail below.

Figure 6:
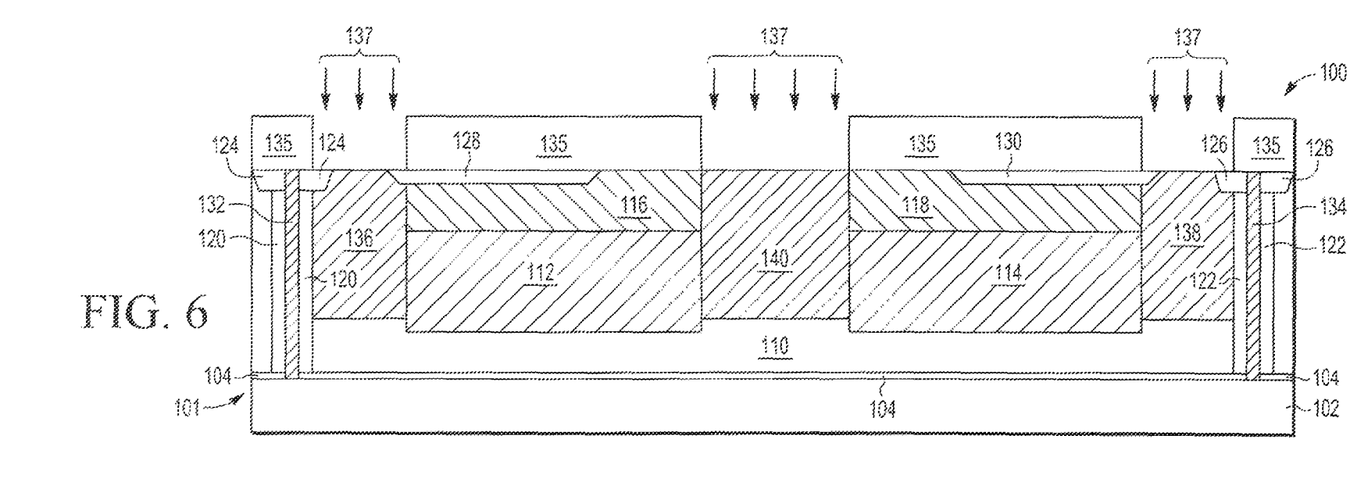

Turning now to FIG. 6, in an exemplary embodiment, after forming the isolation regions and support layer contacts, the fabrication process continues by forming regions 136, 138, 140 of semiconductor material within the active region 110 having the same conductivity of the lateral drift regions 112, 114. As described in greater detail below, the regions 136, 138, 140 functions as vertical drift regions between a drain electrode and a conductive channel of the subsequently formed transistor structure, and accordingly, the regions 136, 138, 140 may alternatively be referred to herein as vertical drift regions. In an exemplary embodiment, the vertical drift regions 136, 138, 140 are formed by masking the body regions 116, 118 of the semiconductor device structure 100 with an implantation mask 135 that is patterned to expose the adjacent regions of the active region 110. The regions 136, 138, 140 are then formed by implanting ions of the same conductivity-determining impurity type as the lateral drift regions 112, 114, illustrated by arrows 137, in the active region 110 with a dopant concentration in the range of about $1 \times 10^{15}/cm^3$ to about $5 \times 10^{16}/cm^3$ at an energy level greater than the energy level used for the body regions 116, 118 to provide the vertical drift regions 136, 138, 140 having a depth that is greater than the depth of the body regions 116, 118. For example, in accordance with one embodiment, for an N-channel semiconductor device, vertical drift regions 136, 138, 140 are formed by implanting N-type ions, such as phosphorous ions or a phosphorous ionized species, with a dopant concentration of about $6 \times 10^{15}/cm^3$ in a series of one of more implants having an energy level in the range of about 30 keV to about 2000 keV to provide vertical drift regions 136, 138, 140 having a depth in the range of about 1.5 microns to about 3 microns relative to the surface of the active region 110. In this regard, at least a lower portion of a respective vertical drift region 136, 138, 140 that extends deeper than the lower boundary of the adjacent body region 116, 118 abuts or otherwise contacts at least a portion of the adjacent lateral drift region 112, 114 to provide an electrical connection (or conductive path) to/from that respective lateral drift region 112, 114, while the upper portion of that respective vertical drift region 136, 138, 140 abuts or otherwise contacts the adjacent body region 116, 118. In this manner, the each body region 116, 118 extends laterally between the central vertical drift region 140 and a respective outer vertical drift region 136, 138. In accordance with one or more embodiments, the ion implantation energy level used to form the vertical drift regions 136, 138, 140 is less than or equal to the ion implantation energy level used to form the lateral drift regions 112, 114 so that the distance between the bottom of the lateral drift regions 112, 114 and the buried layer 104 is less than the distance between the bottom of the vertical drift regions 136, 138, 140 and the buried layer 104, as illustrated in FIG. 6. In other words, the thickness of the remaining portions of the active region 110 having the opposite conductivity type between the lateral drift regions 112, 114 and the buried layer 104 may be less than the thickness of the remaining portions of the active region 110 having the opposite conductivity type between the vertical drift regions 136, 138, 140 and the buried layer 104. It should be noted that although the subject matter is described herein in the context of forming the vertical drift regions and lateral drift regions using separate ion implantation process steps with different implant masks, in alternative embodiments, the vertical drift regions and lateral drift regions may be concurrently formed during a single ion implantation process step prior to forming the body regions, in which case the dopant concentrations and vertical extents of the vertical drift regions and lateral drift regions may be substantially equal or otherwise uniform.

Figure 7:
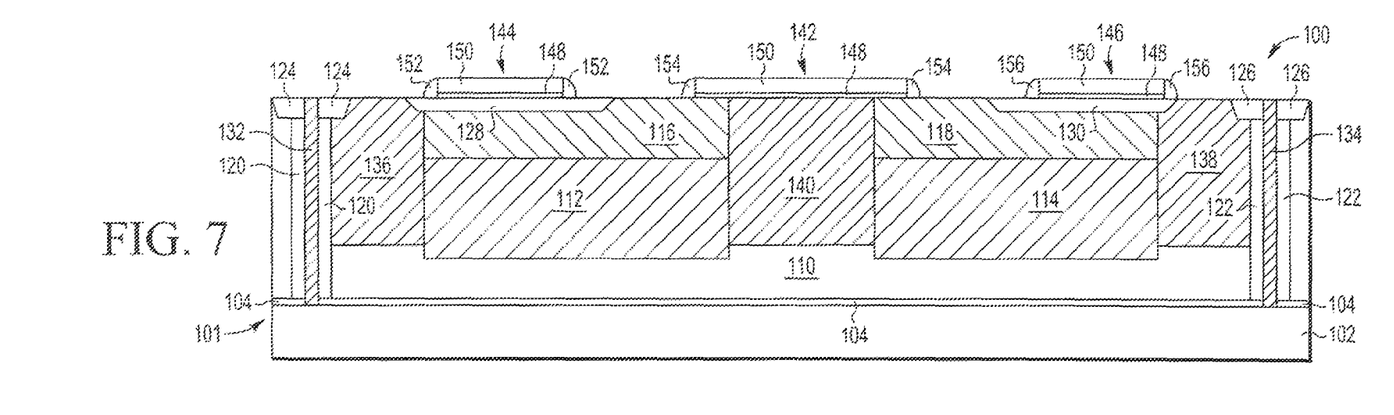

Turning now to FIG. 7, after forming the vertical drift regions 136, 138, 140, the fabrication process continues by removing the implantation mask 135 and fabricating a plurality of electrode structures 142, 144, 146 overlying the active region 110. In this regard, a first electrode structure 142 overlies the center vertical drift region 140 and functions as the conductive gate electrode for the subsequently formed VLDMOS transistor structure while additional electrode structures 144, 146 overlie the isolation regions 128, 130 formed in the body regions 116, 118 to bias the upper surfaces of the isolation regions 128, 130, as described in greater detail below. In this regard, the central electrode structure 142 may alternatively be referred to herein as the gate electrode structure while the electrode structures 144, 146 overlying the isolation regions 128, 130 may alternatively be referred to herein as depletion electrode structures since they do not function as gate electrodes; rather, the depletion electrode structures 144, 146 overlap at least a portion of a respective isolation region 128, 130 to bias the upper surface of the respective isolation region 128, 130 to the drain voltage, which depletes the respective underlying lateral drift regions 112, 114. In exemplary embodiments, the gate structure 142 overlies at least a portion of the body regions 116, 118, that is, the portions of the body regions 116, 118 adjacent to the center vertical drift region 140, to allow inversion channels to form in the body regions 116, 118 during operation of the transistor device, as will be appreciated in the art.

In exemplary embodiments, the electrode structures 142, 144, 146 are formed by forming one or more layers of dielectric material 148 overlying the semiconductor device structure 100, forming one or more layers of conductive (or semiconductive) material 150 overlying the dielectric material 148, and etching the layers of materials 148, 150 to define the electrode structures 142, 144, 146. In this regard, the conductive material 150 functions as the conductive gate electrode material of the gate electrode structure 142 and the underlying portion of dielectric material 148 functions as the gate insulator. In accordance with one or more embodiments, the dielectric material 148 is realized as an oxide material, such as silicon dioxide, that is grown or otherwise formed by oxidizing the exposed surfaces of the active region 110, for example, by performing thermal oxidation by exposing the device structure 100 to an oxidizing ambient at an elevated temperature to promote selective growth of oxide material on the exposed surfaces of the active region 110 to a thickness of about 7 nanometers (nm) to about 35 nm. After the dielectric material 148 is formed, the conductive material 150 may be formed by conformably depositing a conductive material, such as a polycrystalline silicon material, by chemical vapor deposition (CVD) or another suitable deposition process to a thickness of about 100 nm to about 350 nm. After the conductive material 150 is formed, fabrication of the electrode structures 142, 144, 146 may be completed by masking the portions of the materials 148, 150 to be utilized for the gate electrode structures 142, 144, 146 and etching the exposed portions of materials 148, 150 using an anisotropic etchant. In the illustrated embodiment, sidewall spacers 152, 154, 156 are formed about the sidewalls of the electrode structures 142, 144, 146 in a conventional manner, for example, by conformably depositing a layer of nitride material overlying the semiconductor device structure 100 and anisotropically etching the nitride material to remove the nitride material on top of the electrode structures 142, 144, 146.

Figure 8:
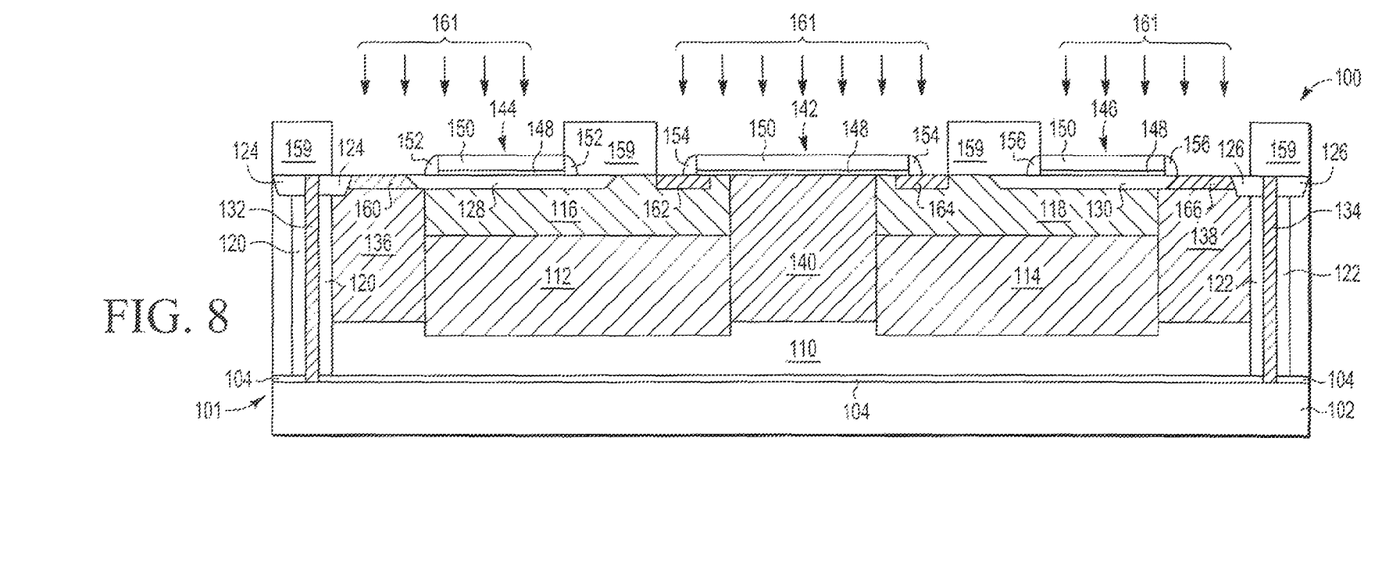
Figure 9:
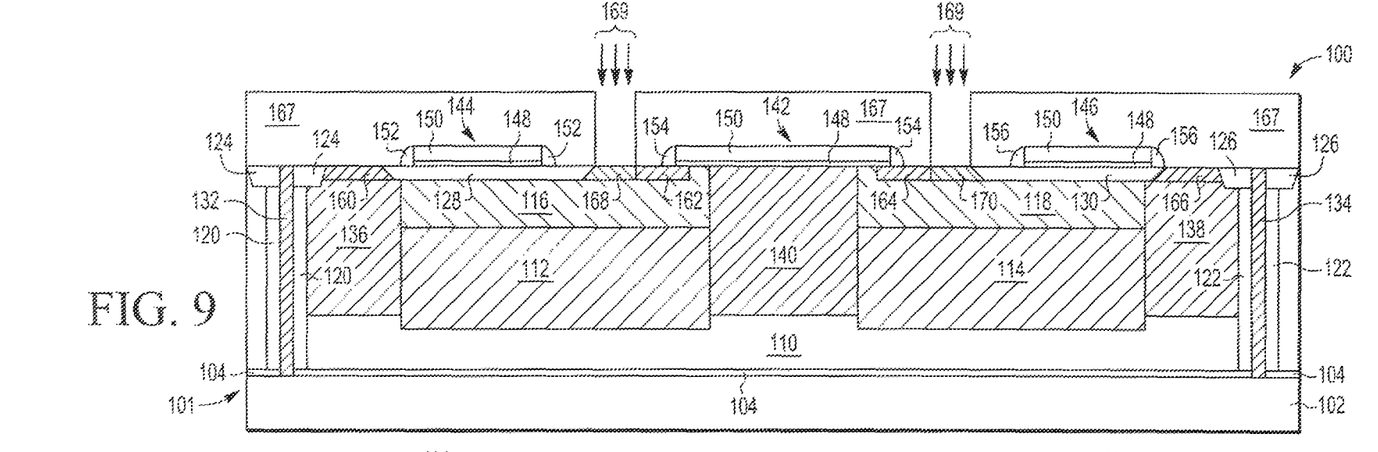

Turning now to FIGS. 8-9, after forming electrode structures 142, 144, 146, fabrication of the semiconductor device structure 100 continues by forming doped electrode contact regions 160, 162, 164, 166, 168, 170 for subsequently forming electrical connections between the semiconductor device structure and external circuitry. In this regard, the contact regions 160, 162, 164, 166, 168, 170 are relatively heavily doped such that they have low resistivity. As illustrated in FIG. 8, in an exemplary embodiment, drain contact regions 160, 166 are formed in vertical drift regions 136, 138 and source contact regions 162, 164 are formed in the body regions 116, 118 proximate the gate electrode structure 142 by masking the semiconductor device structure 100 with an implantation mask 159 that masks portions of the body regions 116, 118 proximate the depletion electrode structures 144, 146 and leaves exposed the remaining portions of the active region 110 to be used for the drain/source contact regions 160, 162, 164, 166. Additionally, the implantation mask 159 may also be patterned to expose the electrode structures 142, 144, 146 so that the electrode structures 142, 144, 146 are concurrently doped during the ion implantation step used to form the drain/source contact regions 160, 162, 164, 166. It should be noted that in alternative embodiments, the drain/source contact regions 160, 162, 164, 166 may be formed with separate ion implantations steps and/or differing dopant concentrations.

In exemplary embodiments, the drain/source contact regions 160, 162, 164, 166 are formed by implanting ions of the same conductivity-determining impurity type as the drift regions 112, 114, 136, 138, 140, illustrated by arrows 161, in the exposed portions of the vertical drift regions 136, 138 and body regions 116, 118 using the implantation mask 159 resulting in the semiconductor device structure 100 of FIG. 8. For example, in accordance with one embodiment, for an N-channel semiconductor device, the drain/source contact regions 160, 162, 164, 166 are formed by implanting N-type ions, such as phosphorous ions or a phosphorous ionized species, with a dopant concentration in the range of about $1\times10^{19}/cm^3$ to about $1\times10^{21}/cm^3$ at an energy level of about 30 keV. In this regard, the ion implantation energy level used for the drain/source contact regions 160, 162, 164, 166 is less than the ion implantation energy level used for the body regions 116, 118 such that the depth of the source regions 162, 164 is less than the depth of the body regions 116, 118 and the depth of the drain regions 160, 166 is less than the depth of the vertical drift regions 136, 138. For example, in one embodiment, phosphorous ions or a phosphorous ionized species are implanted with a dopant concentration of about $1\times10^{21}/cm^3$ at an energy level of about 30 keV to provide drain/source contact regions 160, 162, 164, 166 having a depth of about 100 nm relative to the surface of the active region 110. It will be appreciated that the source contact regions 162, 164 function as the source (or source region) for the subsequently formed transistor structure, whereas the drain (or drain region) for the subsequently formed transistor structure includes the drain contact regions 160, 166 and the drift regions 112, 114, 136, 138, 140. In this regard, the vertical drift regions 136, 138 and lateral drift regions 112, 114 function as drift regions that raise the voltage (or electrical potential) of the portions of the vertical drift region 140 underlying the gate electrode structure 142 adjacent to the body regions 116, 118 proximate the source regions 162, 164 that function as accumulation regions for the transistor device.

Turning now to FIG. 9, in the illustrated embodiment, after forming the drain/source contact regions 160, 162, 164, 166, the fabrication process continues by removing the implantation mask 159 and forming body contact regions 168, 170 in the body regions 116, 118 between a respective source contact region 162, 164 and a respective isolation region 128, 130. In this regard, the semiconductor device structure 100 is masked with an implantation mask 167 that masks the electrode structures 142, 144, 146 and the drain/source contact regions 160, 162, 164, 166 and leaves exposed the remaining portions of the body regions 116, 118. The body contact regions 168, 170 are formed by implanting ions of the same conductivity-determining impurity type as the body regions 116, 118, illustrated by arrows 169, in the exposed portions of the body regions 116, 118 using the implantation mask 167, resulting in the semiconductor device structure 100 of FIG. 9. For example, in accordance with one embodiment, for an N-channel semiconductor device, the body contact regions 168, 170 are formed by implanting P-type ions, such as boron ions or a boron ionized species, with a dopant concentration in the range of about $1 \times 10^{19}/cm^3$ to about $1 \times 10^{21}/cm^3$ at an energy level in the range of about 2 keV to about 6 keV. In this regard, the dopant concentration of the body contact regions 168, 170 is greater than the dopant concentration of the body regions 116, 118 but the ion implantation energy level used for the body contact regions 168, 170 is less than the ion implantation energy level used for the body regions 116, 118 such that the depth of the body contact regions 168, 170 is less than the depth of the body regions 116, 118. For example, in one embodiment, boron ions or a boron ionized species are implanted with a dopant concentration of about $1 \times 10^{21}/cm^3$ at an energy level of about 5 keV to provide drain/source contact regions 160, 162, 164, 166 having a depth of about 100 nm relative to the surface of the active region 110. In this regard, the depth and dopant concentration of the body contact regions 168, 170 may be substantially same as the depth and dopant concentration of the drain/source contact regions 160, 162, 164, 166 but having opposite conductivity.

Figure 10:
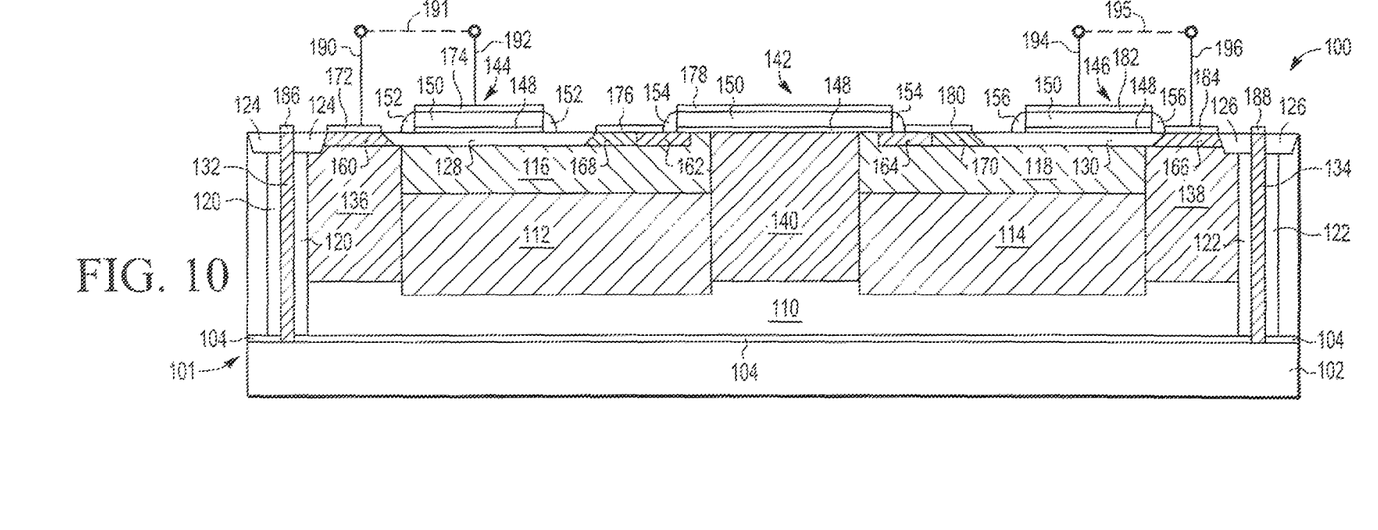

Turning now to FIG. 10, in the illustrated embodiment, after the electrode contact regions 160, 162, 164, 166, 168, 170 are formed, fabrication of the transistor device continues by removing the implantation mask 167 and forming contacts 172, 174, 176, 178, 180, 182, 184 overlying the contact regions 160, 162, 164, 166, 168, 170 and the electrode structures 142, 144, 146. In an exemplary embodiment, the contacts 172, 174, 176, 178, 180, 182, 184 are realized as a metal silicide layer formed by conformably depositing a layer of silicide-forming metal onto the exposed surfaces of the contact regions 160, 162, 164, 166, 168, 170 and the electrode structures 142, 144, 146 and heated, for example by RTA, to react with the exposed silicon and form a metal silicide layer 172, 174, 176, 178, 180, 182, 184 at the top of the respective contact region 160, 162, 164, 166, 168, 170 or electrode structure 142, 144, 146. Any silicide-forming metal that is not in contact with exposed silicon, such as, for example, the silicide-forming metal that is deposited on the isolation regions 124, 126, 128, 130 and sidewall spacers 152, 154, 156, does not react during the RTA to form a silicide and may subsequently be removed in a conventional manner. In this regard, contacts 186, 188 may also be formed overlying the conductive polysilicon contacts 132, 134 to the support layer 102.

In accordance with one or more embodiments, after forming silicide contacts, fabrication of the transistor device continues by forming appropriate electrical interfaces and/or electrical connections to/from the silicide contacts, for example, using subsequently formed interconnect layers overlying the semiconductor device structure 100. In exemplary embodiments, the depletion electrode structures 144, 146 are electrically connected (or shorted) to the drain contact regions 160, 166, for example, by providing a conductive connection 191, 195 between a respective drain contact 172, 184 and a respective depletion contact 174, 182. For example, in one embodiment, terminals 190, 192, 194, 196 (e.g., contact plugs, vias or the like) are formed overlying the contacts 172, 174, 182, 184 and connections 191, 195 are provided between a respective drain terminal 190, 196 and its adjacent depletion terminal 192, 194, for example, by forming the connections 191, 195 using conductive traces in an overlying interconnect layer. In this manner, the isolation regions 128, 130 are disposed laterally between the drain regions 160, 166 and the source regions 162, 164 the upper surfaces of the isolation regions 128, 130 are biased to the drain voltage so that the VLDMOS transistor device is effectively a vertically-diffused double RESURF LDMOS device. As illustrated in FIG. 10, in exemplary embodiments, each source contact region 162, 164 is electrically connected (or shorted) to its adjacent body contact region 168, 170 by its respective overlying contact 176, 180, such that the underlying body regions 116, 118 are biased to the source voltage. In exemplary embodiments, the support layer 102 is biased to a ground voltage, for example, by connecting or otherwise providing the ground voltage to the contacts 186, 188.

Still referring to FIG. 10, during operation of the transistor, when a voltage applied to the gate electrode structure 142 that exceeds the threshold voltage of the transistor, current flows vertically to/from a respective drain contact region 160, 166 through a respective vertical drift region 136, 138 and laterally through a respective lateral drift region 112, 114 before flowing vertically through the vertical drift region 140 from/to the channel portions of the body regions 116, 118 underlying the gate electrode structure 142 between the source contact regions 162, 164 and the vertical drift region 140. In this regard, by virtue of the lateral drift regions 112, 114 being buried beneath the body regions 116, 118, the voltage difference between the drain voltage at the drain contact regions 160, 166 and the source voltage at the source contact regions 162, 164 is distributed vertically (e.g., away from or downward relative to the surface of the semiconductor device structure 100) by the vertical drift regions 136, 138 and laterally along the length of the lateral drift regions 112, 114 before being distributed vertically (e.g., towards the surface of the semiconductor device structure 100) via vertical drift region 140, thereby decreasing the voltage differential across the channel portions of the body regions 116, 118 underlying the gate electrode structure 142 between the source contact regions 162, 164 and the vertical drift region 140, which, in turn, increases the drain-to-source breakdown voltage of the transistor device. Additionally, the buried layer 104 provides a capacitance between the support layer 102 and the active region 110 that vertically distributes the voltage difference between the drain voltage at the drain contact regions 160, 166 and the source voltage to increase the drain-to-source breakdown voltage of the transistor device. In this regard, the vertical drift regions 136, 138, 140 and buried lateral drift regions 112, 114 raise the voltage potential of the underlying active region 110, thereby increasing the voltage across the buried layer 104, which, in turn, reduces the voltage difference that must be distributed between the drain contact regions 160, 166 and the remaining P-type portions of the active region 110 adjacent to the buried layer 104.

It should be noted that in some embodiments, the semiconductor device structure 100 may be rectangular, square, or circular in shape or otherwise formed so that the regions depicted as being separate in the cross-sections of FIGS. 1-10 may be integral or otherwise continuous, as will be appreciated in the art. For example, the gate structure 142 and the underlying vertical drift region 140 may be located substantially at the center of the semiconductor device structure 100 with the remaining regions of the semiconductor device structure 100 being disposed about the gate structure 142, such that the lateral drift regions 112, 114 are integral, the body regions 116, 118 are integral, the vertical drift regions 136, 138 are integral, and so on.

For the sake of brevity, conventional techniques related to semiconductor and/or integrated circuit fabrication, power transistors, biasing, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

In conclusion, systems, devices, and methods configured in accordance with example embodiments of the invention relate to:

In an exemplary embodiment, an apparatus for a semiconductor device structure is provided. The semiconductor device structure includes a first vertical drift region of semiconductor material, a second vertical drift region of semiconductor material, and a buried lateral drift region of semiconductor material, wherein the buried lateral drift region of semiconductor material abuts the first vertical drift region and the second vertical drift region. In one embodiment, the semiconductor device structure includes a gate structure overlying the first vertical drift region, a drain region of semiconductor material within the second vertical drift region, and a body region of semiconductor material laterally between the first vertical drift region and the second vertical drift region and overlying the buried lateral drift region. In another embodiment, the semiconductor device structure includes a third region of semiconductor material between the first vertical drift region and the second vertical drift region, wherein the first vertical drift region, the second vertical drift region, and the buried lateral drift region each have a first conductivity type and the third region has a second conductivity type opposite the first conductivity type. In various embodiments, the third region overlies the buried lateral drift region and abuts the first vertical drift region and the second vertical drift region, and at least a portion of the third region is laterally between the first vertical drift region and a source region of semiconductor material having the first conductivity type. In a further embodiment, the semiconductor device structure includes an isolation region of dielectric material between the source region and the second vertical drift region, wherein the isolation region overlies at least a second portion of the third region and the second portion of the third region overlies the buried lateral drift region. In one embodiment, the semiconductor device structure further comprises a drain region of semiconductor material within the second vertical drift region and having the first conductivity type and an electrode structure overlying the isolation region, wherein the drain region is electrically connected to the electrode structure and the isolation region is laterally between the source region and the drain region. In accordance with yet another embodiment, the semiconductor device structure further comprises a gate structure overlying the first vertical drift region and the portion of the third region. In accordance with one embodiment, the semiconductor device structure further comprises an isolation region of dielectric material overlying the buried lateral drift region and a third region of semiconductor material between the isolation region and the buried lateral drift region, wherein the first vertical drift region, the second vertical drift region, and the buried lateral drift region each have a first conductivity type and the third region has a second conductivity type opposite the first conductivity type. In one embodiment, the semiconductor device structure further comprises a drain region of semiconductor material having the first conductivity type within the second vertical drift region and an electrode structure overlying the isolation region, wherein the electrode structure is electrically connected to the drain region. In yet another embodiment, the semiconductor device structure further comprises a support layer of semiconductor material, a buried layer of dielectric material overlying the support layer, a third region of semiconductor material between the first vertical drift region and the second vertical drift region, the third region having a second conductivity type and overlying the buried lateral drift region, and a fourth region of semiconductor material having the second conductivity type overlying the buried layer, the buried lateral drift region overlying the fourth region.

In another exemplary embodiment, an apparatus for a transistor is provided. The transistor includes a first region of semiconductor material having a first conductivity type, a second region of semiconductor material having the first conductivity type, a third region of semiconductor material having the first conductivity type, wherein the third region abuts at least a first portion of the first region and at least a second portion of the second region, a fourth region of semiconductor material between the first region and the second region, the fourth region overlying the third region and having a second conductivity type, a gate structure overlying the first region, a drain region of semiconductor material within the second region, the drain region having the first conductivity type, and a source region of semiconductor material within the fourth region, the source region having the first conductivity type. In one embodiment, the transistor further comprises an isolation region of dielectric material between the source region and the drain region and an electrode structure overlying the isolation region, wherein the electrode structure is electrically connected to the drain region; and the isolation region is disposed vertically between the electrode structure and the fourth region.

In yet another exemplary embodiment, a method of fabricating a transistor on an active region of semiconductor material having a first conductivity type is provided. The method involves forming a buried lateral drift region of semiconductor material having a second conductivity type within the active region, forming a first vertical drift region of semiconductor material having the second conductivity type within the active region, wherein the first vertical drift region abuts the buried lateral drift region, and forming a second vertical drift region of semiconductor material having the second conductivity type within the active region, wherein the second vertical drift region abuts the buried lateral drift region. In one embodiment, forming the buried lateral drift region comprises forming a lateral drift region having the second conductivity type within the active region and forming a body region of semiconductor material having the first conductivity type within the lateral drift region, wherein a depth of the body region is less than a depth of the lateral drift region resulting in the buried lateral drift region underlying the body region. In another embodiment, the method further comprises forming a body region of semiconductor material having the first conductivity type within the active region overlying the buried lateral drift region, forming a gate structure overlying the first vertical drift region, and forming a source region of semiconductor material having the second conductivity type within the body region proximate the gate structure, wherein the gate structure overlies a portion of the body region disposed between the source region and the first vertical drift region. In one embodiment, the method further comprises forming an isolation region of dielectric material overlying the body region and forming a drain region of semiconductor material having the second conductivity type within the second vertical drift region, wherein the isolation region is disposed laterally between the source region and the drain region. In another embodiment, the method comprises forming a body region of semiconductor material having the first conductivity type within the active region overlying the buried lateral drift region, forming an isolation region of dielectric material overlying the body region, and forming an electrode structure overlying the isolation region.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:

1. A semiconductor device structure comprising:
a first vertical drift region of semiconductor material;
a second vertical drift region of semiconductor material;
a buried lateral drift region of semiconductor material, wherein the buried lateral drift region of semiconductor material abuts the first vertical drift region and the second vertical drift region;
a body region of semiconductor material between the first vertical drift region and the second vertical drift region, the body region overlying the buried lateral drift region;
a gate structure overlying the first vertical drift region; and
a drain region of semiconductor material within the second vertical drift region.

2. The semiconductor device structure of claim 1, wherein:
the first vertical drift region, the second vertical drift region, and the buried lateral drift region each have a first conductivity type; and
the body region has a second conductivity type opposite the first conductivity type.

3. The semiconductor device structure of claim 2, wherein the body region abuts the first vertical drift region and the second vertical drift region.

4. The semiconductor device structure of claim 2, further comprising a source region of semiconductor material having the first conductivity type, wherein at least a portion of the body region is laterally between the source region and the first vertical drift region.

5. The semiconductor device structure of claim 4, further comprising an isolation region of dielectric material between the source region and the second vertical drift region, wherein:
the isolation region overlies at least a second portion of the body region; and
the second portion of the body region overlies the buried lateral drift region.

6. The semiconductor device structure of claim 5, further comprising:
an electrode structure overlying the isolation region, wherein the drain region is electrically connected to the electrode structure and the isolation region is laterally between the source region and the drain region.

7. The semiconductor device structure of claim 4, wherein the gate structure overlies the portion of the body region.

8. The semiconductor device structure of claim 1, further comprising:
an isolation region of dielectric material overlying the buried lateral drift region, wherein:
the first vertical drift region, the second vertical drift region, and the buried lateral drift region each have a first conductivity type; and
the body region has a second conductivity type opposite the first conductivity type; and
the body region resides between the isolation region and the buried lateral drift region.

9. The semiconductor device structure of claim 8, further comprising:
an electrode structure overlying the isolation region, wherein the electrode structure is electrically connected to the drain region.

10. The semiconductor device structure of claim 1, further comprising:
a support layer of semiconductor material;
a buried layer of dielectric material overlying the support layer; and
a fourth region of semiconductor material overlying the buried layer, the buried lateral drift region overlying the fourth region.

11. The semiconductor device structure of claim 10, wherein:
the drain region, the first vertical drift region, the second vertical drift region, and the buried lateral drift region have a first conductivity type; and
the body region and the fourth region have a second conductivity type.

12. A transistor comprising:
a first drift region of semiconductor material having a first conductivity type;
a second drift region of semiconductor material having the first conductivity type;
a third drift region of semiconductor material having the first conductivity type, wherein the third drift region abuts at least a first portion of the first drift region and at least a second portion of the second drift region;
a body region of semiconductor material between the first drift region and the second drift region, the body region overlying the third drift region and having a second conductivity type;
a gate structure overlying the first drift region;
a drain region of semiconductor material within the second drift region, the drain region having the first conductivity type; and
a source region of semiconductor material within the body region, the source region having the first conductivity type.

13. The transistor of claim 12, wherein a portion of the body region underlies the gate structure and resides between the source region and the first drift region.

14. The transistor of claim 12, further comprising:
- an isolation region of dielectric material between the source region and the drain region; and
- an electrode structure overlying the isolation region, wherein:
  - the electrode structure is electrically connected to the drain region; and
  - the isolation region is disposed between the electrode structure and the body region.

15. A semiconductor device structure comprising:
- a first drift region of semiconductor material having a first conductivity type;
- a second drift region of semiconductor material having the first conductivity type;
- a third drift region of semiconductor material having the first conductivity type, wherein the third drift region abuts at least a first portion of the first drift region and at least a second portion of the second drift region;
- a body region of semiconductor material between the first drift region and the second drift region, the body region overlying the third drift region and having a second conductivity type;
- a gate structure overlying the first drift region;
- a drain region of semiconductor material within the second drift region, the drain region having the first conductivity type;
- a source region of semiconductor material within the body region, the source region having the first conductivity type;
- an isolation region of dielectric material between the source region and the drain region; and
- an electrode structure overlying the isolation region, wherein:
  - the electrode structure is electrically connected to the drain region; and
  - the isolation region is disposed between the electrode structure and the body region.

16. The semiconductor device structure of claim 15, further comprising:
- a support layer of semiconductor material;
- a buried layer of dielectric material overlying the support layer; and
- a fourth region of semiconductor material having the second conductivity type overlying the buried layer, the third drift region overlying the fourth region.

* * * * *